(12) United States Patent
Song

(10) Patent No.: US 7,869,175 B2
(45) Date of Patent: Jan. 11, 2011

(54) DEVICE FOR PROTECTING SEMICONDUCTOR IC

(75) Inventor: Sang-Soo Song, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 567 days.

(21) Appl. No.: 11/870,902

(22) Filed: Oct. 11, 2007

(65) Prior Publication Data

US 2008/0157204 A1    Jul. 3, 2008

(30) Foreign Application Priority Data

Dec. 29, 2006    (KR) .................... 10-2006-0137353

(51) Int. Cl.
*H02H 9/00*    (2006.01)
(52) U.S. Cl. ...................................... 361/56
(58) Field of Classification Search ............ 361/56
See application file for complete search history.

(56) References Cited

U.S. PATENT DOCUMENTS 5,663,589 A * 9/1997 Saitoh et al. .............. 257/401
6,353,237 B1 * 3/2002 Yu ............................. 257/173
7,170,726 B2 * 1/2007 Ker et al. ................... 361/56
7,224,560 B2 * 5/2007 May et al. .................. 361/56

* cited by examiner

*Primary Examiner*—Ronald W Leja
(74) *Attorney, Agent, or Firm*—Sherr & Vaughn, PLLC

(57) ABSTRACT

Embodiments relate to a device for protecting a semiconductor IC device from an electrostatic discharge (ESD). According to embodiments, the device may have a rapid response speed and a stable operation against an ESD and may efficiently protect an internal circuit of a semiconductor IC from an ESD voltage lower than a junction breakdown voltage. According to embodiments, the device for protecting the semiconductor IC may include a pad, an internal circuit electrically connected to the pad, and a protection circuit which forms a discharge path between the pad and the internal circuit and disconnects the pad and the internal circuit, when an overvoltage due to an electrostatic discharge is applied to the pad.

19 Claims, 2 Drawing Sheets

DEVICE FOR PROTECTING SEMICONDUCTOR IC

The present application claims priority under 35 U.S.C. 119 and 35 U.S.C. 365 to Korean Patent Application No. 10-2006-0137353 (filed on Dec. 29, 2006), which is hereby incorporated by reference in its entirety.

BACKGROUND

A complementary metal-oxide-semiconductor (CMOS) IC device may use a gate oxide film having a small thickness. Hence, a CMOS IC device may be vulnerable to an electrostatic discharge (ESD).

ESD may occur when electrostatic charges are transferred between two objects having different electrostatic potentials.

Since a large amount of energy may be instantaneously emitted in a short time of about 150 ns or less due to the ESD, the CMOS IC device may be damaged. In particular, the ESD may be an important factor related to reliability of a nano IC device.

Due to the ESD, thermal breakdown of silicon may occur, a metal contact may be fused due to instantaneous high current, or insulation breakdown of a gate oxide film may occur due to a high voltage and excessive stress, thereby causing failure of an IC chip.

In human body model (HBM) ESD stress, the ESD standard of a commercially available IC product may be 2 kV, and in machine model (MM) ESD stress, the ESD standard may be 200 V.

In order to avoid such ESD stress, an ESD protection circuit may be mounted on the chip. Accordingly, the ESD stress may be avoided and the IC chip may be protected.

FIG. 1 is a circuit diagram showing a related art ESD protection device. As shown in FIG. 1, a grounded gate NMOS (GGNMOS) may be used as the ESD protection circuit.

The ESD protection circuit may have a large size. However, if a size of the protection circuit is large, a parasitic component may increase in an input terminal.

Referring to FIG. 1, the related art ESD protection circuit 12 may be connected between pad 10 and internal circuit 16.

Internal circuit 16 may be connected to pad 10 via input buffer 14 between $V_{DD}$ and $V_{SS}$. Input buffer 14 may include PMOS transistor P1 and NMOS transistor N1 that may be connected in an inverter structure between $V_{DD}$ and $V_{SS}$.

The related art ESD protection circuit 12 may include a plurality (eight to ten) of GGNMOSs M11, M12, M13, M14, M15, M16, M17 and M18, which may be arranged between pad 10 and ground $V_{SS}$ in parallel. The gates and the sources of the GGNMOSs may be connected to $V_{SS}$ via a substrate (or a well) and the drains thereof may be connected to pad 10.

Accordingly, the GGNMOS may have a structure including an npn bipolar transistor in which the source, the substrate, and the drain may be connected. Since the npn bipolar transistor may be a bulk device unlike an MOSFET which may be a surface device, a large amount of current may be consumed in an ON state.

When the IC chip normally operates, that is, when a nominal voltage is applied via pad 10, the GGNMOSs may be turned off. Accordingly, a gate voltage Vgs may be 0 and current may not flow between the drains and sources of the GGNMOSs.

When ESD occurs in the IC chip, a high electric field may be applied to the drains of the GGNMOSs via pad 10, and impact ionization or avalanche may occur in a reverse-biased drain/substrate junction. A voltage across a substrate resistor may increase a base-emitter voltage of the npn bipolar transistor. As a result, the npn bipolar transistor may be turned on.

When the ESD voltage has a positive (+) polarity, a parasitic npn bipolar transistor included in the GGNMOSs may form a discharge path. The parasitic npn bipolar transistor may electrically disconnect input buffer 14 and pad 10 to protect internal circuit 16 of the semiconductor IC chip from the ESD voltage.

In contrast, when the ESD voltage has a negative (−) polarity, a forward connection pn diode (p-type substrate and $n^+$ drain) included in the GGNMOSs may form a discharge path to protect internal circuit 16.

However, the related art ESD protection circuit may be implanted only when all the eight to ten GGNMOSs operate. However, all the GGNMOSs may not operate due to a layout or other factors and failure may occur at a low immunity level.

In the related art ESD protection circuit, since the GGNMOSs use lateral parasitic bipolar operations, the internal circuit of the IC chip may be shocked due to a high voltage before reaching a junction breakdown voltage.

SUMMARY

Embodiments relate to a semiconductor device, and more particularly, to a device for protecting a semiconductor integrated circuit (IC) device from an electrostatic discharge (ESD).

Embodiments relate to a device for protecting a semiconductor IC having a rapid response speed and a stable operation against an ESD.

Embodiments relate to a device for protecting a semiconductor IC, which may be capable of efficiently protecting an internal circuit of a semiconductor IC chip from an ESD voltage lower than a junction breakdown voltage.

Embodiments relate to a device for protecting a semiconductor IC, which is capable of efficiently and stably operating while occupying a small area in a semiconductor IC chip.

According to embodiments, a device for protecting a semiconductor device may include a pad, an internal circuit electrically connected to the pad, and a protection circuit which forms a discharge path between the pad and the internal circuit and disconnects the pad and the internal circuit, when an overvoltage due to an electrostatic discharge is applied to the pad.

According to embodiments, the protection circuit may include a plurality of grounded gate NMOSs (GGNMOSs) connected in parallel between the pad and the internal circuit in a multi-stage form, and a high-voltage transistor connected between the pad and the plurality of GGNMOSs.

According to embodiments, the protection circuit may include a plurality of grounded gate NMOSs (GGNMOSs) connected in parallel between the pad and the internal circuit in a multi-stage form, a high-voltage transistor connected between the pad and the plurality of GGNMOSs, and a resistor connected between the gates of the plurality of GGNMOSs and ground.

According to embodiments, the protection circuit may include a silicon controlled rectifier (SCR) including a npn bipolar transistor and a pnp bipolar transistor, and a high-voltage transistor connected between a well of the SCR and the pad.

DRAWINGS

DESCRIPTION

Figure 1:
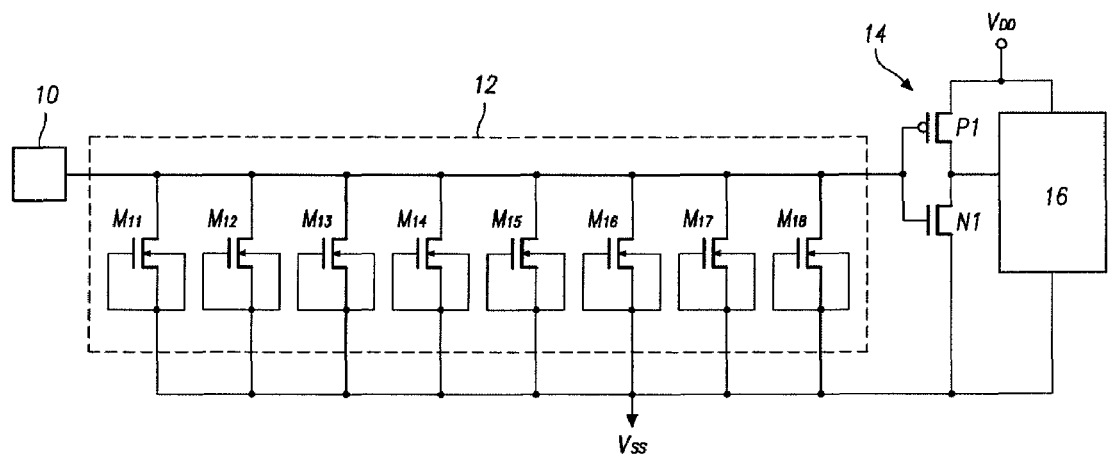
FIG. 1 is a circuit diagram illustrating a related art ESD protection circuit.
Figure 2:
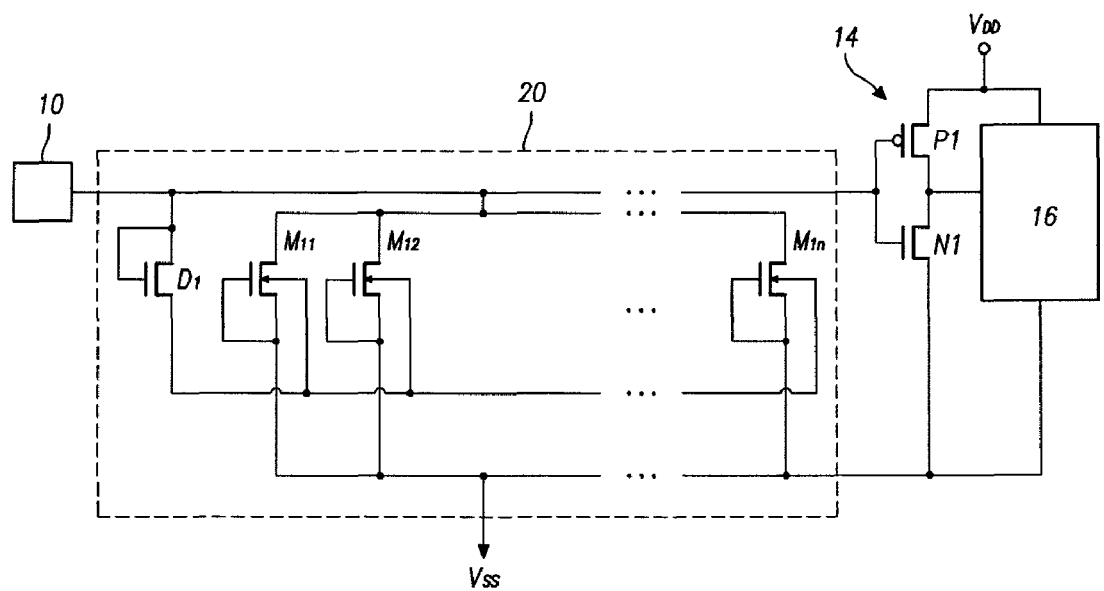
FIG. 2 is a circuit diagram illustrating a protection circuit according to embodiments.

FIG. 2 is a circuit diagram showing a protection circuit according to embodiments.

Referring to FIG. 2, ESD protection device 20, which may protect a semiconductor IC device, may be connected between pad 10 and input buffer 14, according to embodiments.

Internal circuit 16 of the semiconductor IC chip may be electrically connected to pad 10 via input buffer 14 and ESD protection device 20.

Pad 10 may serve as a passage and may electrically connect a semiconductor IC chip to an external device.

Although pad 10 may be an input pad in FIG. 2, according to embodiments, pad 10 may be an output pad or a power pad.

Input buffer 14 may include PMOS transistor P1 and NMOS transistor N1 connected in an inverter structure between $V_{DD}$ and $V_{SS}$. However, in embodiments, the structure of input buffer 14 may not be limited to this example.

The ESD protection device according to embodiments may include a plurality of GGNMOSs $M_{11}$, $M_{12}$, ..., and $M_{1n}$, which may be connected between pad 10 and ground $V_{SS}$ in parallel. According to embodiments, the gates and the sources of the GGNMOSs may be connected to $V_{SS}$ via a substrate (or a well) in parallel and the drains thereof may be connected to pad 10. For example, eight to ten GGNMOSs may be connected in parallel. The drains of the plurality of GGNMOSs may be commonly connected to pad 10, and the gates and the sources thereof arranged in parallel may be commonly connected to $V_{SS}$ via the substrate (or the well).

In embodiments, ESD protection device 20 according to embodiments may include a high-voltage transistor D1 connected between pad 10 and the well of the GGNMOSs. In embodiments, in ESD protection device 20 in which the GGNMOSs may be arranged from pad 10 in a multi-stage form, high-voltage transistor D1 may be further provided at a side of pad 10. High-voltage transistor D1 may be provided between pad 10 and the GGNMOSs arranged in the multi-stage form.

The gate and the drain of high-voltage transistor D1 may be connected to pad 10 in parallel and the source of high-voltage transistor D1 may be connected to a P-type substrate (that is, a P-type well) of the GGNMOSs.

In ESD protection device 20 according to embodiments, in the connection structure of each GGNMOS, the gate and the source of each GGNMOS may be connected to $V_{SS}$ in parallel and the drain thereof may be connected to pad 10, unlike the related art ESD protection device.

The well of each GGNMOS and the source of high-voltage transistor D1 may be commonly connected to $V_{SS}$. That is, the P-type substrate (that is, the P-type well) of each GGNMOS may be connected to $V_{SS}$, the source of high-voltage transistor D1 may be connected to the P-type substrate (that is, the P-type well), and the gate and the source of each GGNMOS may be connected in parallel.

In embodiments, a threshold voltage of high-voltage transistor D1 may be equal to or larger than twice the operation voltage of the transistor used in internal circuit 16 and may be smaller than a junction breakdown voltage.

When the IC chip operates normally, that is, when a signal applied to pad 10 may be a nominal voltage, a voltage lower than the threshold voltage may be applied to high-voltage transistor D1 and thus the high-voltage transistor may be turned off. Accordingly, a signal applied to pad 10 may be sent to internal circuit 16 via input buffer 14.

In contrast, if ESD occurs and an overvoltage significantly larger than the nominal voltage is applied to pad 10, a discharge path may be formed by ESD protection device 20 according to embodiments, and pad 10 and input buffer 14 may be disconnected. That is, when ESD occurs, high-voltage transistor D1 may be turned on and current flowing through high-voltage transistor D1 flows from the source of high-voltage transistor D1 to the P-type well of the GGNMOSs. According to embodiments, the current flowing into the P-type well flows out via ground $V_{ss}$. The current flowing out via ground may generate a potential difference due to the resistance of the P-type well.

The potential of the P-type well may increase due to the generated potential difference. Due to the increased potential, an insulation breakdown value between the P-type well and the drains of the GGNMOSs may decrease. As a result, ESD protection device 20 according to embodiments may rapidly and stably operate at a voltage lower than that of the related art ESD protection device including the GGNMOSs.

Figure 3:
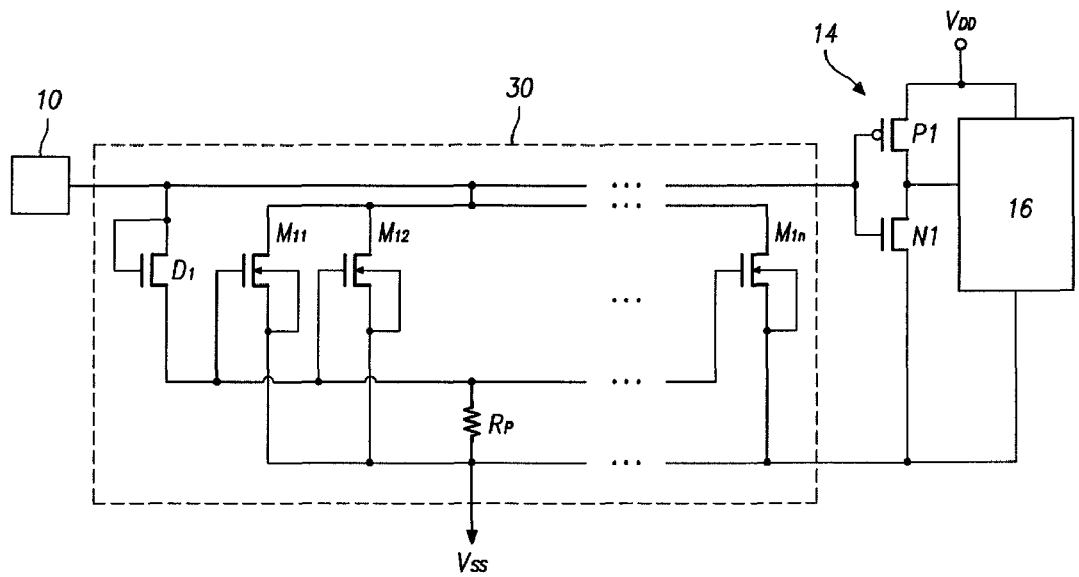
FIG. 3 is a circuit diagram illustrating a protection circuit according to embodiments.

FIG. 3 is a circuit diagram illustrating a protection circuit according to embodiments.

The circuit diagram illustrated in FIG. 3 is similar to the circuit illustrated in FIG. 2, in that a plurality of GGNMOSs and high-voltage transistor D1 may be included.

However, the circuit of FIG. 3 differs in a connection structure of high-voltage transistor D1 and the GGNMOSs. That is, the source of high-voltage transistor D1 and the gates of the GGNMOSs may be connected to $V_{ss}$ via a resistor Rp.

In embodiments, high-voltage transistor D1 may be provided between pad 10 and the GGNMOSs arranged in the multi-stage form.

The gate and the drain of high-voltage transistor D1 may be connected to pad 10 in parallel and the source of high-voltage transistor D1 and the gates of the GGNMOSs may be connected to $V_{ss}$ via resistor Rp. The sources of the GGNMOSs may be connected to $V_{ss}$ via the well and the drains thereof may be connected to pad 10. Accordingly, the drains of the GGNMOSs may be commonly connected to pad 10 and the sources thereof may be commonly connected to $V_{ss}$ via the substrate (or the well).

The protection device 30 according to embodiments may also include resistor Rp. The gate voltages of the GGNMOSs may be controlled using resistor Rp.

Since the gate voltages may be controlled using resistor Rp, it may be possible to prevent an area from increasing due to the use of high-voltage transistor D1 in the ESD protection circuit.

Resistor Rp, according to in embodiments, may be formed of polycrystalline silicon. Resistor Rp may solve a stress that may occur when high-voltage transistor D1 is turned on. Therefore, the circuit may be implemented with a small area and the damage of the circuit due to heat may be suppressed.

When the IC chip operates normally, that is, when a signal applied to pad 10 may be a nominal voltage, a voltage lower than the threshold voltage may be applied to high-voltage transistor D1 and thus the high-voltage transistor may be turned off. Accordingly, the signal applied to pad 10 may be sent to internal circuit 16 via input buffer 14.

In contrast, if ESD occurs and an overvoltage significantly larger than the nominal voltage is applied to pad 10, a discharge path may be formed by ESD protection device 20 according to embodiments, and may disconnect pad 10 and input buffer 14. That is, if ESD occurs, high-voltage transistor D1 may be turned on and current flowing through high-voltage transistor D1 may flow into $V_{ss}$ via the source of high-voltage transistor D1, the gates of the GGNMOSs, and resistor Rp. According to embodiments, a voltage corresponding to the potential difference across resistor Rp may be applied to the gates of all the GGNMOSs. Accordingly, the GGNMOSs operate at a lower electrostatic voltage.

Figure 4:
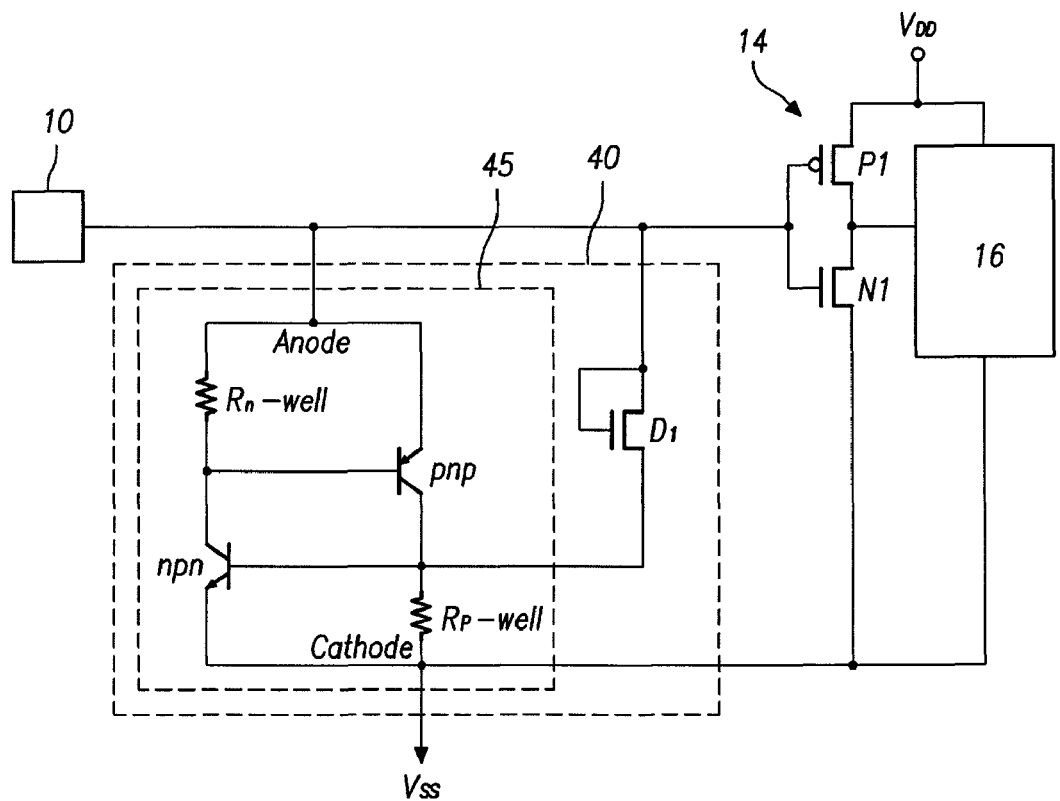
FIG. 4 is a circuit diagram illustrating a protection circuit according to embodiments.

FIG. 4 is a circuit diagram showing a protection circuit according to embodiments.

The circuit ollustrated in FIG. 4 may be different from the circuits of FIG. 2 and FIG. 3 in that the GGNMOSs may not be used. Protection device 40 according to embodiments may use a silicon controlled rectifier (SCR) instead of the GGNMOSs.

Since the SCR may use a latch phenomenon, infinite electrostatic stress may be solved by only one SCR. Due to the capability of the SCR, the circuit may be implanted with an area smaller than that of the protection device using eight to ten GGNMOSs.

However, if the SCR is used, a trigger voltage (also called a switching voltage) necessary for the operation of the SCR may be high. For example, in a very large scale integration IC device, the trigger voltage may be approximately 22 V, which may be higher than an insulation breakdown voltage of the gate oxide film of the input terminal. Accordingly, the internal circuit of the IC chip may be broken down before the electrostatic stress may be solved by the SCR.

Due to these problems, a structure or technology for decreasing the trigger voltage of the SCR has been developed. A structure for decreasing a trigger voltage, such as a modified lateral SCR (MLSCR) or a low voltage triggering SCR (LVTSCR), may be used or a technology for increasing a turn-on speed of a SCR of an auxiliary triggering circuit (for example, a gate coupling type technology, a high-temperature triggering technology, a GGNMOS triggering method, a substrate triggering method, a double triggering method or the like) may be used.

However, the SCR may not be widely used as an ESD protection device.

However, in embodiments, to decrease the trigger voltage of the SCR, high-voltage transistor D1 may be inserted between the P-type well of the LVTSCR and pad 10.

Referring to FIG. 4, protection device 40 according to embodiments may be connected between pad 10 and input buffer 14. Protection device 40 may include a SCR 45 and a high-voltage transistor D1.

SCR 45 may have a 2-terminal/4-layer pnpn (that is, P+/N-well/P-well/N+) structure, which may include a horizontal npn transistor and a vertical pnp bipolar transistor. In embodiments, the npn or pnp transistor included in SCR 45 may not be limited to the bipolar transistor. For convenience of description, however, the bipolar transistor will be described herein.

The trigger voltage of SCR 45 may be determined by the avalanche breakdown voltage of the N-well/P-well.

If a voltage larger than the avalanche breakdown voltage is applied to the anode of SCR 45 and the cathode of SCR 45 may be connected to ground $V_{ss}$, hole/electron current may be generated by an avalanche phenomenon.

The generated hole current may flow into the P+ region connected to ground $V_{ss}$ via the P-well, and the generated electron current may flow into the N+ region connected to the anode of SCR 45 via the N-well.

If the potential difference across the P-well resistor (Rp-well) or the N-well resistor (Rn-well) is larger than the threshold voltage (for example, 0.7 V) of the bipolar transistor, the npn bipolar transistor or the pnp bipolar transistor may be turned on. Accordingly, the hole current or the electron current may further reinforce the bias of the npn bipolar transistor or the pnp bipolar transistor. Thus, the latch operation of SCR 45 may be initiated.

When SCR 45 is triggered to initiate the latch operation, holding current for holding the turn-on state of the npn bipolar transistor and the pnp bipolar transistor may be generated via a positive feedback regenerative mechanism, although the avalanche breakdown may not be repeated.

In embodiments, if electrostatic stress occurs in the IC chip and an overvoltage larger than the nominal voltage is applied to pad 10, high-voltage transistor D1 may be turned on and the current flowing through high-voltage transistor D1 may flow into $V_{ss}$ via the P-well. Accordingly, a potential difference may be generated due to the resistance of the P-well. The generated potential difference may drive the npn bipolar transistor. The driven npn bipolar transistor may allow the pnp bipolar transistor, which may be driven by the electrostatic stress applied from pad 10 to the anode of the pnp bipolar transistor, to be driven at a lower trigger voltage. That is, the pnp bipolar transistor may be driven at a lower trigger voltage compared with a case of using only the SCR.

According to embodiments, when electrostatic stress may be applied via the pad, the operation voltage or the trigger voltage of the means (GGNMOS or SCR) for forming the discharge path may decrease. Accordingly, a response speed of the ESD protection device against the electrostatic stress may increase. Thus, the electrostatic stress may be removed in a shorter time.

According to embodiments, it may be possible to efficiently prevent a failure of a semiconductor IC chip due to the electrostatic stress.

According to embodiments, since the operations of all the elements forming the discharge path may be reliably performed, it may be possible to more stably implement the ESD protection device. In addition, it may be possible to provide an ESD protection device capable of performing an efficient operation while occupying a small area.

It will be apparent to those skilled in the art that various modifications and variations may be made to embodiments. Thus, it is intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A device, comprising:
  a pad;
  an internal circuit electrically connected to the pad; and
  a protection circuit coupled between the pad and the internal circuit, wherein the protection circuit comprises:
    a plurality of grounded gate NMOSs (GGNMOSs) connected in parallel between the pad and the internal circuit in a multi-stage form, and
    a high-voltage transistor connected between the pad and the plurality of GGNMOSs,
  wherein a gate and a drain of the high-voltage transistor are connected to the pad in parallel, and a source of the high-voltage transistor is connected to ground.

2. The device of claim 1, wherein when a nominal voltage is applied to the pad, the protection circuit is turned off to send the applied nominal voltage to the internal circuit, and when the overvoltage higher than the nominal voltage is applied to the pad, the protection circuit is turned on to form the discharge path.

3. The device of claim 1, wherein drains of the plurality of GGNMOSs are commonly connected to the pad, and gates and sources of the plurality of GGNMOSs are commonly connected to ground in parallel.

4. The device of claim 1, wherein a source of the high-voltage transistor and gates and sources of the plurality of GGNMOSs are connected to ground via a well of the GGNMOSs.

5. The device of claim 1, wherein a threshold voltage of the high-voltage transistor is equal to or greater than twice an operation voltage of the internal circuit and is less than a junction breakdown voltage.

6. The device of claim 1, wherein when a nominal voltage is applied to the pad, a voltage lower than a threshold voltage of the high-voltage transistor is applied to the high-voltage transistor, the high-voltage transistor is turned off, and the applied nominal voltage is sent to the internal circuit, and wherein when the overvoltage higher than the nominal voltage is applied to the pad, the high-voltage transistor is turned on to form the discharge path to ground.

7. The device of claim 6, wherein, when a potential difference across a well of the GGNMOSs increases due to current flowing through the high-voltage transistor which is turned on, the increased potential difference decreases an operation voltage of the protection circuit.

8. The device of claim 1, wherein the protection circuit comprises a resistor connected between gates of the plurality of GGNMOSs and ground.

9. The device of claim 8, wherein the resistor and the gates of the plurality of GGNMOSs are commonly connected to a source of the high-voltage transistor.

10. The device of claim 1, wherein the protection circuit comprises:
   a silicon controlled rectifier (SCR) including a npn bipolar transistor and a pnp bipolar transistor; and
   a high-voltage transistor connected between a well of the SCR and the pad.

11. The device of claim 10, wherein the SCR comprises a 2-terminal/4-layer pnpn structure including the npn bipolar transistor and the pnp bipolar transistor.

12. The device of claim 10, wherein the high-voltage transistor is connected between a P-well of the npn bipolar transistor and the pad.

13. The device of claim 10, wherein when the overvoltage higher than a nominal voltage is applied to the pad, the high-voltage transistor is turned on, and a potential difference across a P-well of the npn bipolar transistor drives the npn bipolar transistor due to current flowing through the high-voltage transistor, which is turned on.

14. The device of claim 13, wherein, when the npn bipolar transistor is driven, the pnp bipolar transistor is driven at a lower trigger voltage.

15. A device, comprising:
   a pad;
   an internal circuit electrically connected to the pad; and
   a protection circuit coupled between the pad and the internal circuit,
   wherein the protection circuit comprises:
      a plurality of grounded gate NMOSs (GGNMOSs) connected in parallel between the pad and the internal circuit in a multi-stage form;
      a high-voltage transistor connected between the pad and the plurality of GGNMOSs; and
      a resistor connected between gates of the plurality of GGNMOSs and ground,
   wherein a gate and a drain of the high-voltage transistor are connected to the pad in parallel and a source of the high-voltage transistor and gates of the plurality of GGNMOSs are commonly connected to the resistor.

16. The device of claim 15, wherein the resistor comprises polycrystalline silicon.

17. The device of claim 15, wherein drains of the plurality of GGNMOSs are commonly connected to the pad, gates of the plurality of GGNMOSs are commonly connected to the resistor, and sources of the plurality of GGNMOSs are commonly connected to ground.

18. The device of claim 15, wherein a source of the high-voltage transistor and gates of the plurality of GGNMOSs are connected to ground via the resistor, and sources of the plurality of GGNMOSs are commonly connected to ground.

19. A device, comprising:
   a pad;
   an internal circuit electrically connected to the pad; and
   a protection circuit coupled between the pad and the internal circuit, wherein the protection circuit comprises:
      a plurality of grounded gate NMOSs (GGNMOSs) connected in parallel between the pad and the internal circuit in a multi-stage form;
      a high-voltage transistor connected between the pad and the plurality of GGNMOSs; and
      a resistor connected between gates of the plurality of GGNMOSs and ground,
   wherein when the overvoltage higher than a nominal voltage is applied to the pad, the high-voltage transistor is turned on, a voltage corresponding to a potential difference across the resistor is applied to gates of the plurality of GGNMOSs due to current flowing through the high-voltage transistor which is turned on, and an operation voltage of the GGNMOSs decreases.

* * * * *